(12) United States Patent
Lee et al.

(10) Patent No.: US 11,189,552 B2
(45) Date of Patent: Nov. 30, 2021

(54) SEMICONDUCTOR PACKAGE

(71) Applicant: SAMSUNG ELECTRONICS CO., LTD., Suwon-si (KR)

(72) Inventors: Jae Ean Lee, Suwon-si (KR); Tae Sung Jeong, Suwon-si (KR); Young Gwan Ko, Suwon-si (KR); Suk Ho Lee, Suwon-si (KR); Jung Soo Byun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/867,004

(22) Filed: May 5, 2020

(65) Prior Publication Data
US 2020/0266137 A1   Aug. 20, 2020

Related U.S. Application Data

(63) Continuation of application No. 15/913,429, filed on Mar. 6, 2018, now Pat. No. 10,665,535.

(30) Foreign Application Priority Data

Nov. 1, 2017   (KR) .......................... 10-2017-0144881

(51) Int. Cl.
*H01L 23/495* (2006.01)
*H01L 23/498* (2006.01)
(Continued)

(52) U.S. Cl.
CPC .... *H01L 23/49816* (2013.01); *H01L 21/4853* (2013.01); *H01L 21/4857* (2013.01);
(Continued)

(58) Field of Classification Search
CPC ..... H01L 21/4853; H01L 24/05; H01L 24/13; H01L 2221/68345; H01L 2224/0231;
(Continued)

(56) References Cited

U.S. PATENT DOCUMENTS

| | | |
|---|---|---|
| 5,450,283 A | 9/1995 | Lin et al. |
| 5,901,050 A | 5/1999 | Imai |

(Continued)

FOREIGN PATENT DOCUMENTS

| | | |
|---|---|---|
| CN | 104299952 A | 1/2015 |
| JP | 2003-158239 A | 5/2003 |

(Continued)

OTHER PUBLICATIONS

Communication dated May 21, 2019 issued by the Japanese Intellectual Property Office in counterpart Japanese Application No. 2018-044608.

(Continued)

*Primary Examiner* — Nitin Parekh
(74) *Attorney, Agent, or Firm* — Sughrue Mion, PLLC

(57) ABSTRACT

A semiconductor package includes a semiconductor chip; a connection member having a first surface on which the semiconductor chip is disposed and a second surface opposing the first surface, an encapsulant disposed on the first surface of the connection member and encapsulating the semiconductor chip, a passivation layer on the second surface of the connection member; and an UBM layer partially embedded in the passivation layer, wherein the UBM layer includes an UBM via embedded in the passivation layer and connected to the redistribution layer of the connection member and an UBM pad connected to the UBM via and protruding from a surface of the passivation layer, and a width of a portion of the UBM via in contact with the UBM pad is narrower than a width of a portion of the UBM via in contact with the redistribution layer.

20 Claims, 15 Drawing Sheets

(51) Int. Cl.
  *H01L 21/48* (2006.01)
  *H01L 23/31* (2006.01)
  *H01L 23/29* (2006.01)
  *H01L 23/00* (2006.01)

(52) U.S. Cl.
  CPC .... *H01L 23/3185* (2013.01); *H01L 23/49822* (2013.01); *H01L 23/49827* (2013.01); H01L 23/293 (2013.01); H01L 23/3128 (2013.01); H01L 24/05 (2013.01); H01L 24/13 (2013.01); H01L 2221/68345 (2013.01); H01L 2224/0231 (2013.01); H01L 2224/02375 (2013.01); H01L 2224/02377 (2013.01); H01L 2224/05624 (2013.01); H01L 2224/05639 (2013.01); H01L 2224/05644 (2013.01); H01L 2224/05647 (2013.01); H01L 2224/05655 (2013.01); H01L 2224/16238 (2013.01); H01L 2224/32225 (2013.01); H01L 2224/73204 (2013.01); H01L 2224/81005 (2013.01); H01L 2224/97 (2013.01); H01L 2924/014 (2013.01)

(58) Field of Classification Search
  CPC . H01L 2224/02377; H01L 2224/73204; H01L 2224/81005
  USPC .......................................... 257/668, 773, 786
  See application file for complete search history.

(56) References Cited

U.S. PATENT DOCUMENTS

| | | | |
|---|---|---|---|
| 6,075,712 A | 6/2000 | McMahon | |
| 6,100,589 A | 8/2000 | Tanaka | |
| 6,709,897 B2 | 3/2004 | Cheng et al. | |
| 6,781,224 B2 | 8/2004 | Yoneda et al. | |
| 6,825,541 B2 | 11/2004 | Huang et al. | |
| 7,420,278 B2 | 9/2008 | Tomita | |
| 8,183,147 B2* | 5/2012 | Koike | H01L 24/11 438/620 |
| 8,952,538 B2* | 2/2015 | Matsuki | H01L 24/11 257/773 |
| 8,980,691 B2 | 3/2015 | Lin | |
| 2003/0011070 A1 | 1/2003 | Iijima et al. | |
| 2004/0041270 A1 | 3/2004 | Shimizu et al. | |
| 2004/0056344 A1 | 3/2004 | Ogawa et al. | |
| 2005/0017343 A1* | 1/2005 | Kwon | H01L 24/12 257/698 |
| 2006/0121719 A1 | 6/2006 | Nakamura et al. | |
| 2006/0272854 A1 | 12/2006 | Yamano | |
| 2006/0283625 A1 | 12/2006 | Yamamichi et al. | |
| 2007/0035008 A1 | 2/2007 | Wu et al. | |
| 2008/0258300 A1 | 10/2008 | Kobayashi et al. | |
| 2010/0210103 A1* | 8/2010 | Sameshima | H01L 23/525 438/637 |
| 2010/0301459 A1* | 12/2010 | Akiba | H01L 24/11 257/620 |
| 2011/0024899 A1 | 2/2011 | Masumoto et al. | |
| 2011/0156248 A1* | 6/2011 | Matsuki | H01L 24/03 257/737 |
| 2011/0198748 A1* | 8/2011 | Koike | H01L 23/53238 257/737 |
| 2012/0018874 A1 | 1/2012 | Lin et al. | |
| 2012/0061821 A1 | 3/2012 | Black et al. | |
| 2013/0280826 A1 | 10/2013 | Scanlan et al. | |
| 2015/0021758 A1 | 1/2015 | Tsai et al. | |
| 2015/0084206 A1* | 3/2015 | Lin | H01L 23/5389 257/774 |
| 2015/0102503 A1 | 4/2015 | Lin et al. | |
| 2015/0179616 A1 | 6/2015 | Lin et al. | |
| 2015/0200166 A1* | 7/2015 | Kono | H01L 23/562 257/529 |
| 2015/0235845 A1* | 8/2015 | Sekita | H01L 21/31144 438/667 |
| 2015/0371936 A1 | 12/2015 | Chen et al. | |
| 2016/0093580 A1 | 3/2016 | Scanlan et al. | |
| 2016/0133592 A1 | 5/2016 | Okumura | |
| 2017/0278766 A1 | 9/2017 | Kim et al. | |
| 2017/0278812 A1 | 9/2017 | Lee et al. | |
| 2017/0373031 A1* | 12/2017 | Yajima | H01L 24/13 |
| 2018/0047571 A1 | 2/2018 | Hunt et al. | |
| 2018/0061794 A1* | 3/2018 | Kim | H01L 24/82 |

FOREIGN PATENT DOCUMENTS

| | | |
|---|---|---|
| JP | 2006-339421 A | 12/2006 |
| JP | 2007-027706 A | 2/2007 |
| JP | 2008-263125 A | 10/2008 |
| JP | 2013-538460 A | 10/2013 |
| JP | 2014-160705 A | 9/2014 |
| JP | 2016-92339 A | 5/2016 |
| JP | 2017-175112 A | 9/2017 |
| JP | 2017-175123 A | 9/2017 |

OTHER PUBLICATIONS

Korean Office Action dated Jan. 16, 2019 issued in Korean Patent Application No. 10-2017-0144881 (with English translation).
Office Action issued in corresponding Taiwanese Application No. 107107342, dated Feb. 19, 2019.

* cited by examiner

SEMICONDUCTOR PACKAGE

CROSS-REFERENCE TO RELATED APPLICATION(S)

This application is a continuation of U.S. application Ser. No. 15/913,429 filed Mar. 6, 2018 in the U.S. Patent and Trademark Office, which claims the benefit of priority to Korean Patent Application No. 10-2017-0144881 filed Nov. 1, 2017 in the Korean Intellectual Property Office, the disclosures of which are incorporated herein by reference in their entirety.

TECHNICAL FIELD

The present disclosure relates to a semiconductor package.

BACKGROUND

In accordance with improvements of the specifications of a set and/or use of a high bandwidth memory (HBM), a die to die interposer market has grown. Currently, silicon has mainly been used as a material of an interposer, but a glass or an organic material has been developed in order to increase an area and reduce costs. A connecting portion connecting the interposer to a main board, or the like, of the set, is known as an under bump metallurgy (UBM) layer. Reliability of the connecting portion may be significantly affected by a structure of the UBM layer. The structure of the UBM layer thus needs to be optimized.

In the interposer according to the related art, a redistribution layer (RDL) is formed, a die is attached to the RDL, a package process of molding the die is performed, the package is separated from a carrier, and the UBM layer is formed on a lower surface of the package in contact with the carrier by processes such as a process of forming vias, an exposure process, a plating process, and the like. However, in this case, it may be difficult to perform a process due to warpage in the package. Therefore, a separate carrier needs to be further used, and a dedicated line for a process of forming the UBM layer needs to be built up. In addition, products passing through a package line having low cleanliness pass through a second exposure process and a plating process, which have a high degree of cleanliness requirements. A risk of reduced process quality, a risk of a yield reduction, or the like, thus exists.

SUMMARY

An aspect of the present disclosure may provide a semiconductor package having a structure of an under bump metallurgy (UBM) layer having a simplified manufacturing process and in which high reliability is secured.

According to an aspect of the present disclosure, a semiconductor package may be provided, in which a process of forming an UBM layer is used before a redistribution layer on which a semiconductor chip is to be mounted is formed, and an UBM pad protrudes from a passivation layer.

According to an aspect of the present disclosure, a semiconductor package may include: a semiconductor chip having connection pads; a connection member having a first surface on which the semiconductor chip is disposed and a second surface opposing the first surface and including a redistribution layer electrically connected to the connection pads; an encapsulant disposed on the first surface of the connection member and encapsulating the semiconductor chip; a passivation layer disposed on the second surface of the connection member; and an UBM layer partially embedded in the passivation layer and connected to the redistribution layer of the connection member, wherein the UBM layer includes an UBM via embedded in the passivation layer and connected to the redistribution layer of the connection member and an UBM pad connected to the UBM via and protruding from a surface of the passivation layer, and a width of a portion of the UBM via in contact with the UBM pad is narrower than a width of a portion of the UBM via in contact with the redistribution layer.

According to another aspect of the present disclosure, a semiconductor package may include: a connection member having first and second surfaces opposing each other and including an insulating layer and a redistribution layer formed in the insulating layer; a semiconductor chip disposed on the first surface of the connection member and having connection pads electrically connected to the redistribution layer; an encapsulant disposed on the first surface of the connection member and encapsulating the semiconductor chip; an UBM via disposed on the second surface of the connection member and connected to the redistribution layer of the connect ion member; a passivation layer disposed on the second surface of the connection member and embedding the UBM via therein; and an UBM pad connected to the UBM via and protruding from a surface of the passivation layer, wherein the UBM via has a structure integrated with a portion of the redistribution layer in contact with the UBM via.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connect ion" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. The terms "first," "second," etc. may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even ii it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
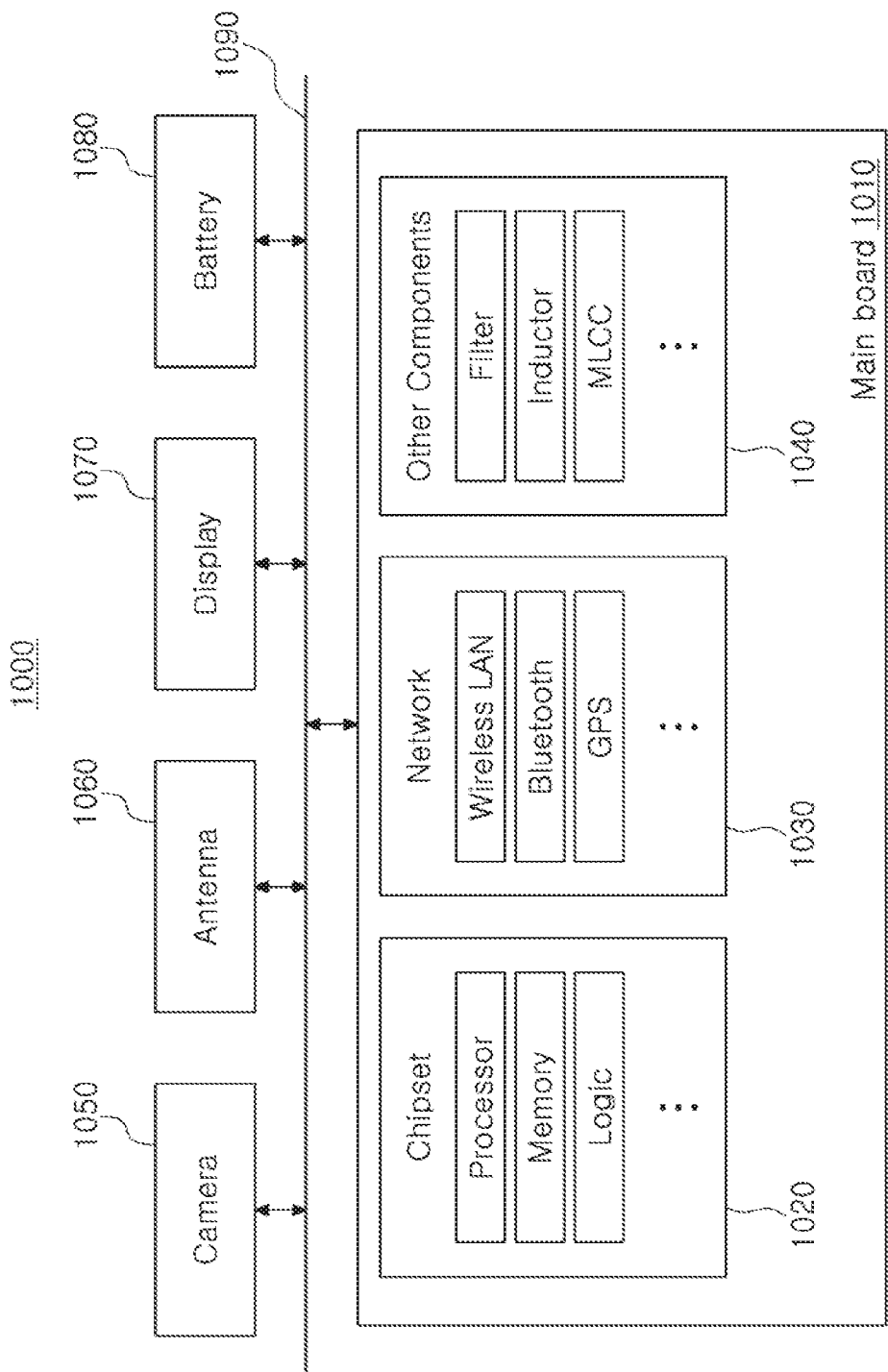
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 includes chip related components 1020, network related components 1030, other components 1040, and the like, physically or electrically connected thereto. These components are connected to other components, to be described below, to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as, for example, a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as, for example, wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include, without limitation, a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be, for example, a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
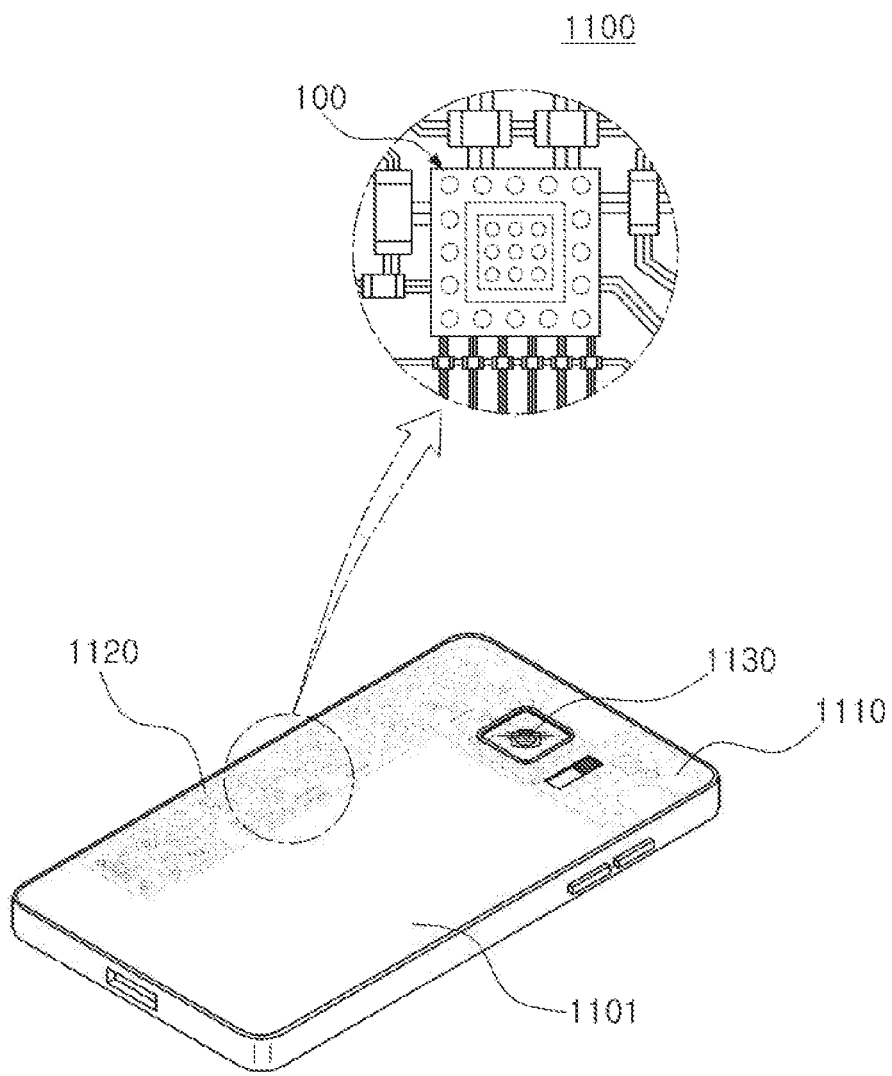
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the main board 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a main board of the electronic device in terms of electrical connection. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor and the main board may be desirable.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
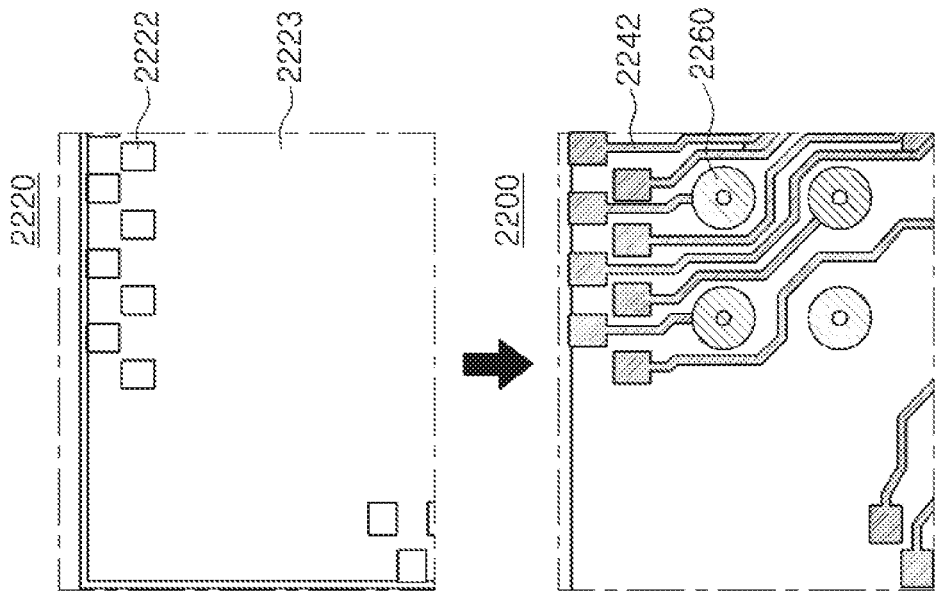
FIGS. 3A and 3B are schematic cross-sectional views illustrating states of a fan-in semiconductor package before and after being packaged.
Figure 3A:
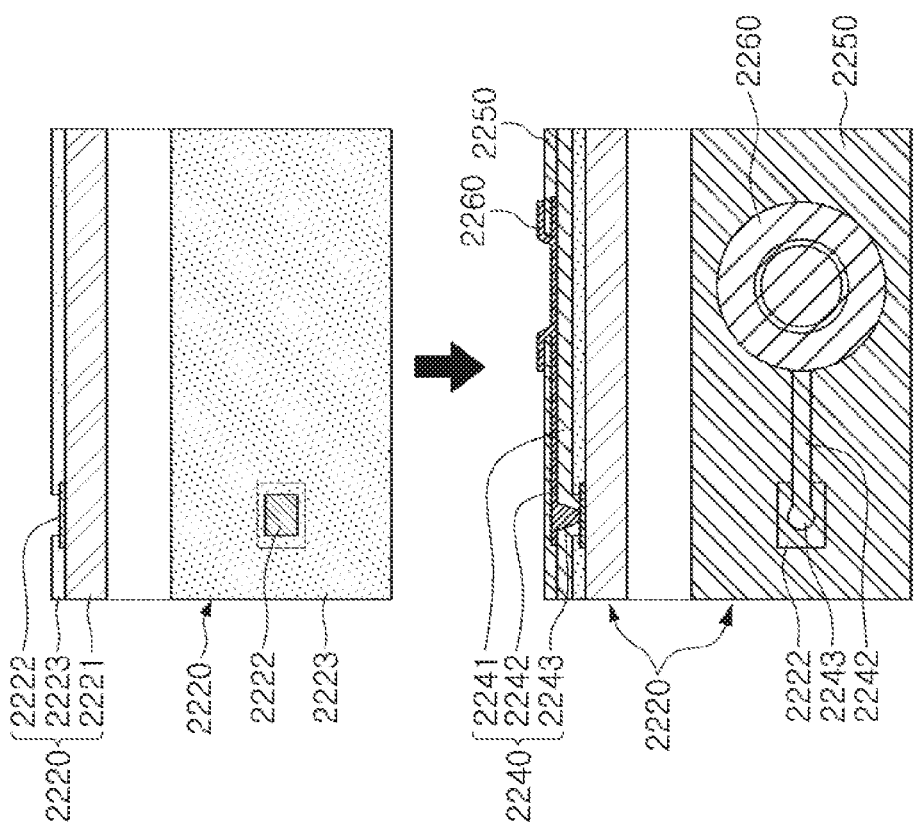
Figure 4:
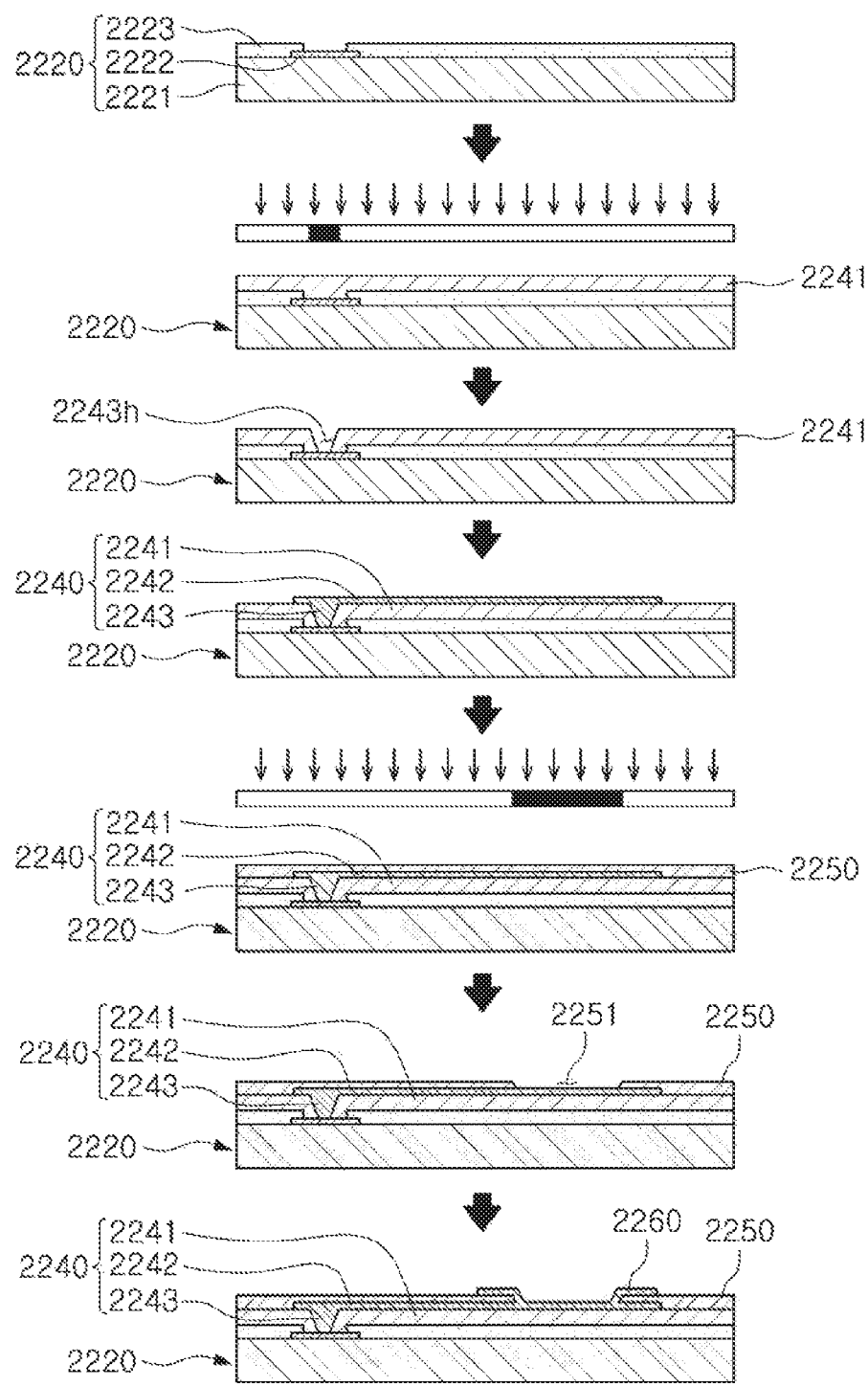
FIG. 4 is schematic cross-sectional views illustrating a packaging process of a fan-in semiconductor package.

FIGS. 3A and 3*b* are schematic cross-sectional views illustrating states of a fan-in semiconductor package before and after being packaged. FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including, without limitation, silicon (Si), germanium (Ge), gallium arsenide (GaAs), or the like, connection pads 2222 formed on one surface of the body 2221 and including a conductive material such as, for example, aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it may be difficult to apply this structure to a semiconductor chip having a large number of I/O terminals or a semiconductor chip having a small size. In addition, due to the issues described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
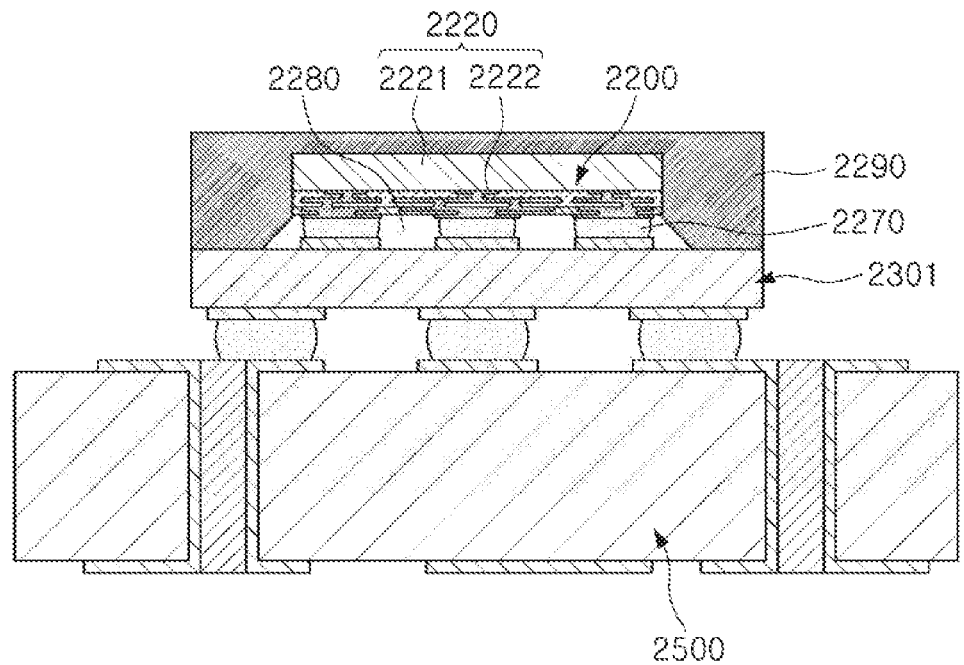
FIG. 5 is a schematic cross-sectional view illustrating a case in which a fan-in semiconductor package is mounted on an interposer substrate and is ultimately mounted on a main board of an electronic device.
Figure 6:
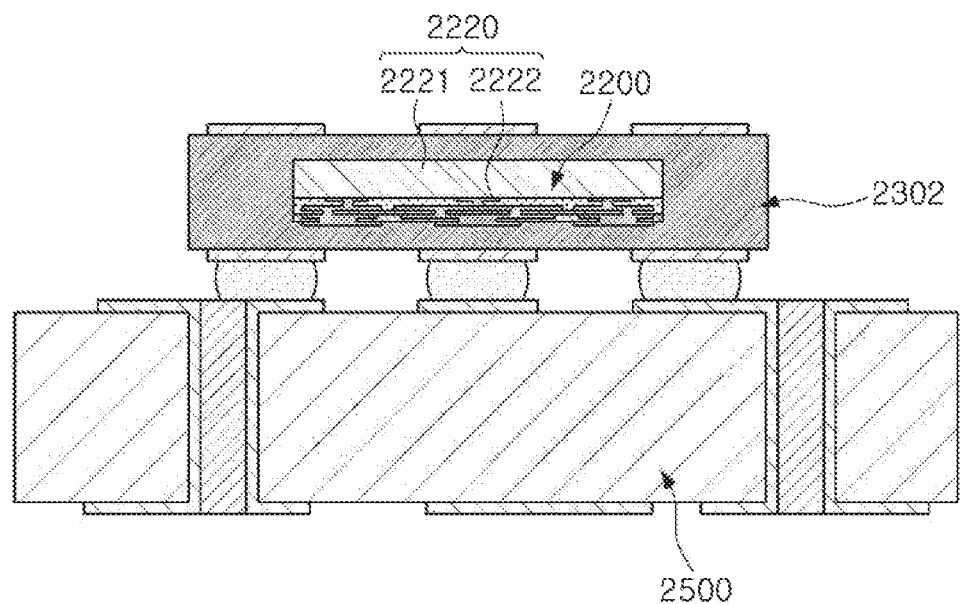
FIG. 6 is a schematic cross-sectional view illustrating a case in which a fan-in semiconductor package is embedded in an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device. FIG. 6 is a schematic cross-sectional view illustrating a case in which a fan-in semiconductor package is embedded in an interposer substrate and is ultimately mounted on a main board of an electronic device.

Referring to FIG. 5, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an external surface of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
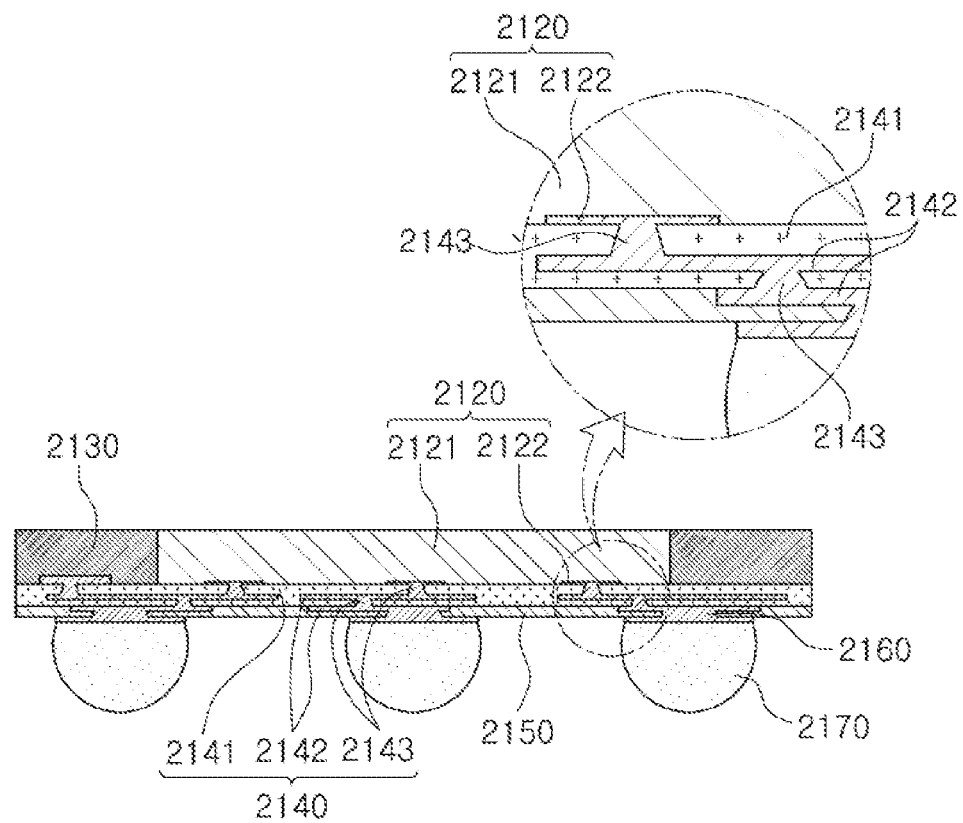
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for the connection member 2140 is performed from the via connecting the redistribution layers and the connection pads 2122 of the semiconductor chip 2120 to each other and the redistribution layers, and the vias 2143 may thus have a width reduced toward the semiconductor chip (see the enlarged region).

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
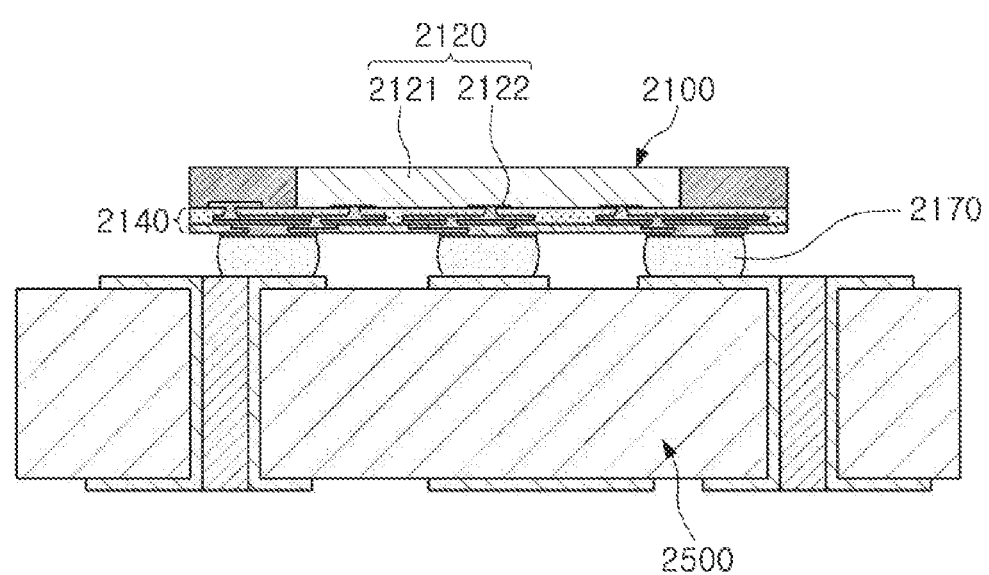
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of an area of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of warpage.

The fan-out semiconductor package refers to package technology for mounting the semiconductor chip on the main board of the electronic device, or the like, as described above, and protecting the semiconductor chip from external impacts. Fan-out semiconductor package is a concept different from that of a printed circuit board (PCB) such as an interposer substrate, or the like, having a scale, a purpose, and the like, different from those of the fan-out semiconductor package, and having the fan-in semiconductor package embedded therein.

Various exemplary embodiments of a semiconductor package having a structure of an under bump metallurgy (UBM) layer having a simplified process and high reliability will hereinafter be described in detail with reference to the accompanying drawings.

Figure 9:
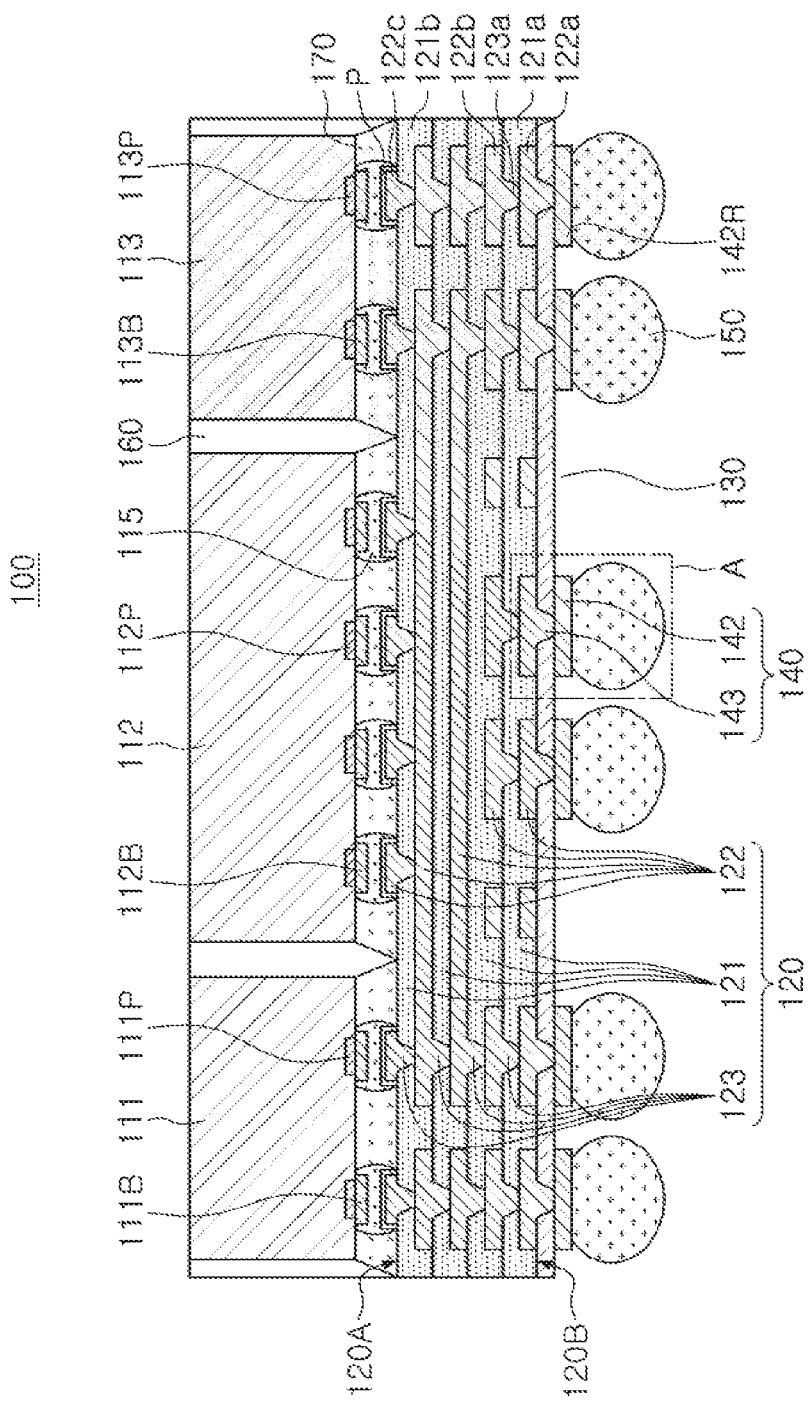
FIG. 9 is a side cross-sectional view illustrating a semiconductor package according to an exemplary embodiment in the present disclosure.

FIG. 9 is a side cross-sectional view illustrating a semiconductor package according to an exemplary embodiment in the present disclosure.

Referring to FIG. 9, a semiconductor package 100 according to the present exemplary embodiment includes semiconductor chips 111, 112, and 113 and a connection member 120 having a first surface 120A on which the semiconductor chips 111, 112, and 113 are disposed and a second surface 120B opposing the first surface 120A.

The connection member 120 includes redistribution layers 122. The semiconductor chips 111, 112, and 113 have connection pads 111P, 112P, and 113P, respectively. The connection pads 111P, 112P, and 113P are electrically connected to the redistribution layer 122 of the connection member.

The semiconductor package 100 includes a passivation layer 130 disposed on the second surface 120B of the connection member 120 and an underbump metallurgy (UBM) layer 140 partially embedded in the passivation layer 130. The UBM layer 140 may improve reliability of connection with connection terminals 150 such as solder balls, resulting in improvement of board level reliability of the semiconductor package 100.

The UBM layer 140 includes UBM vias 143 connected to the redistribution layer 122 of the connection member 120 and UBM pads 142 connected to the UBM vias 143. In the present exemplary embodiment, the UBM vias 143 may be embedded in the passivation layer 130, while the UBM pads 142 may protrude from a surface of the passivation layer 130.

Therefore, both of easy connection to the UBM pads 142 and structural stability of the UBM layer 140 may be ensured. Exposure of the UBM pads 142 may be performed by a resin removing process such as plasma etching (see FIG. 14C).

Figure 10:
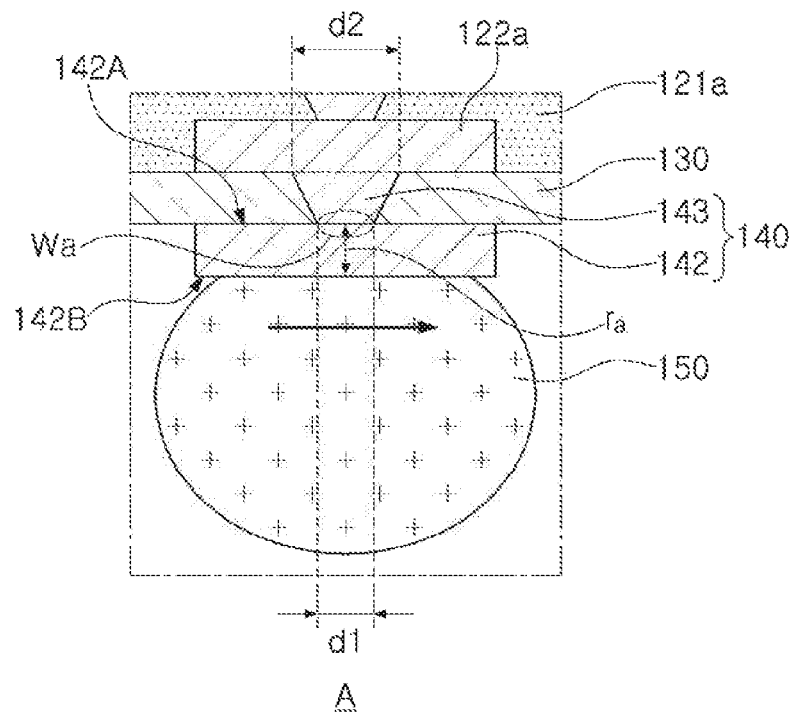
FIG. 10 is an enlarged view illustrating a region (part A) of the semiconductor package illustrated in FIG. 9.

As illustrated in FIG. 10, the UBM via 143 may be connected to a first redistribution layer 122a disposed at the outermost portion among the redistribution layers 122, and a width d1 of a portion of the UBM via 143 in contact with the UBM pad 142 may be narrower than a width d2 of a portion of the UBM via 143 in contact with the first redistribution layer 122a.

As illustrated in FIG. 10, the UBM via 143 may have a reverse trapezoidal shape (or a truncated inverse pyramidal shape, i.e., a pyramid with a base on top contacting the first redistribution layer 122a, and a truncated top side on the bottom contacting the UMB pad 142) when viewed from a cross section in a thickness direction. In addition, the UBM via 143 may be a filled-via of which an inner portion is almost filled, similar to a via 123 of the connection member 120.

In terms of adhesive strength, the portion of the UBM via 143 in contact with the UBM pad 142 may be understood as a weak point of which adhesive strength is smaller than that of the portion of the UBM via 143 in contact with the first redistribution 122a. Such a structure may improve reliability of the UBM layer exposed to various impacts.

Figure 11:
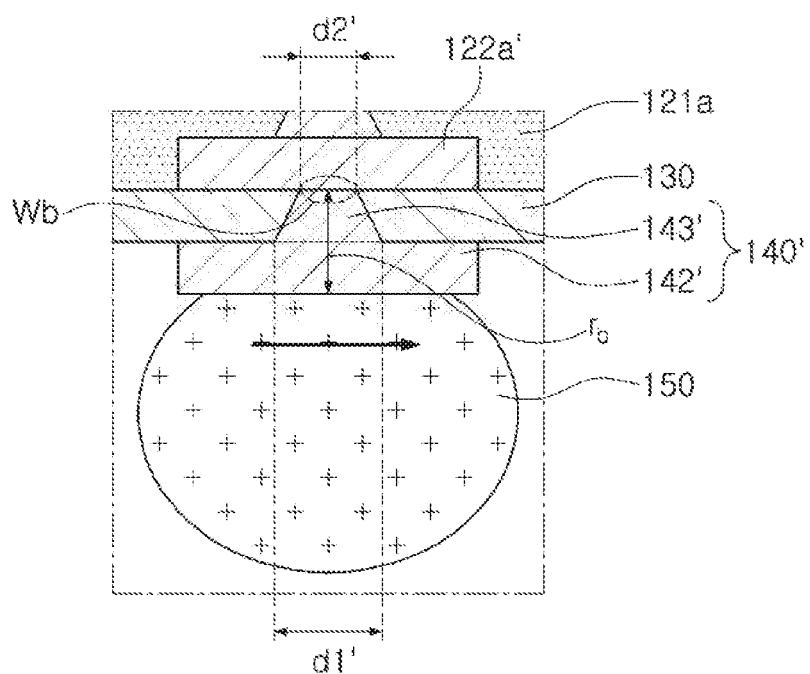
FIG. 11 is an enlarged view illustrating a region of the semiconductor package.

In FIG. 11, a UBM layer 140' having a structure different from a structure depicted in FIG. 10 is illustrated. The UBM layer 140' may include a UBM via 143' of which a width d1' of a portion in contact with a UBM pad 142' is greater than a width d2' of a portion in contact with a first redistribution layer 122', as opposed to the structure depicted in FIG. 10.

As illustrated in FIGS. 10 and 11, stress may be applied to the UBM layer 140 or 140' in a transverse direction (see arrows) through the connection terminals 150 in a mounting process or a use environment. In this case, a moment applied to the weak point may have a decisive influence on reliability, and a magnitude of such a moment may be in proportion to a distance $r_a$ or $r_b$ between the UBM layer 140 and a point at which the stress is applied. Therefore, the distance $r_a$ between the UBM layer 140 depicted in FIG. 10 and the point at which the stress is applied is smaller than the distance $r_b$ between the UBM layer 140' depicted in FIG. 11 and the point at which the stress is applied, and the UBM layer 140 of FIG. 10 may thus have high reliability against stress due to external impacts, or the like.

In the embodiment depicted in FIG. 10, the UBM pad 142 may have a first surface 142A connected to the UBM via 143 and a second surface 142B opposing the first surface 142A. The first surface 142A of the UBM pad 142 may have a level substantially the same as that of an exposed surface of the passivation layer 130. In another exemplary embodiment, side surfaces of the UBM pad 142 may have a structure in which only portions thereof are exposed so that the second surface 142B of the UBM pad 142, that is, a surface of the UBM pad 142 on which the connection terminal is to be formed, is sufficiently exposed.

In a general interposer, a redistribution layer is formed on an insulating layer, a semiconductor chip is attached to the redistribution layer, a package process of molding the semiconductor chip is performed to form a package, the package is separated from a carrier, and a UBM layer is formed on a lower surface of the package in contact with the carrier by processes such as a process of forming vias, an exposure process, a plating process, and the like. Such a process is called a 'UBM layer last method'. In the UBM layer last method, it may be difficult to perform a process due to warpage in the package. Therefore, a separate carrier needs to be further used, and particularly, a dedicated line for a process of forming the UBM layer needs to be built up. In addition, products passing through a package line having low cleanliness again pass through an exposure process and a plating process, which require a high degree of cleanliness. A risk of reduced process quality, a risk of a yield reduction, or the like, may thus exist. A manufacturing process according to the presently disclosed embodiments may solve such problems. This will be described in detail in a manufacturing process to be described below (see FIGS. 13A through 13D and 14A through 14D).

In general, in a case in which the UBM layer last method is used, when holes for UBM vias are formed, the holes may be drilled from an exposed surface of a passivation layer. Therefore, as illustrated in FIG. 11, the UBM via 143' of which the width d1' of the portion in contact with the UBM pad 142' is greater than the width d2' of the portion in contact with the first redistribution layer 122' is formed, and it may thus be considered that a structure of the UBM layer 140' has reliability lower than that of a structure of the UBM layer 140 used in the embodiment depicted in FIG. 10.

Other components of the semiconductor package 100 according to an embodiment will hereinafter be described in more detail.

In an embodiment, the semiconductor package 100 may include a plurality of semiconductor chips 111, 112, and 113. However, the semiconductor package 100 is not limited thereto, but may include one semiconductor chip or other number of semiconductor chips. Each of the semiconductor chips 111, 112, and 113 may be, for example, a processor chip such as a central processor (for example, a CPU), a graphic processor (for example, a GPU), a field programmable gate array (FPGA), a digital signal processor, a cryptographic processor, a microprocessor, a microcontroller, or the like, a logic chip such as an analog-to-digital converter, an application-specific IC (ASIC), or the like, a memory chip such as; a volatile memory (for example, a DRAM), a non-volatile memory (for example, a ROM), a flash memory, a high bandwidth memory (HBM), or the like. In some exemplary embodiments, in the semiconductor package 100, various kinds of chips may be combined with one another. For example, the first semiconductor chip 111 and the third semiconductor chip 113 may be memory chips such as high bandwidth memories (HBMs), or the like, and the second semiconductor chip 112 may be a processor chip such as an application processor (AP), or the like.

The semiconductor chips 111, 112, and 113 may be integrated circuits (ICs) each having several hundreds to several millions of elements or more integrated in a single chip. In this case, a base material of a body of each of the semiconductor chips may be silicon (Si), germanium (Ge), gallium arsenide (GaAs), or the like. Various circuits may be formed on each of the bodies. The respective connection pads 111P, 112P, and 113P of the semiconductor chips 111, 112, and 113 may electrically connect the respective semiconductor chips 111, 112, and 113 to other components. A material of each of the connection pads 111P, 112P, and 113P may be a conductive material such as aluminum (Al), copper (Cu), gold (Au), nickel (Ni), silver (Ag), or an alloy including any one or more of these elements, or the like, but is not limited thereto. A passivation layer exposing the connection pads 111P, 112P, and 113P may be formed on each of the bodies, and may be an oxide film, a nitride film, or the like, or a double layer of an oxide layer and a nitride layer. In some exemplary embodiments, redistribution layers may be further formed on the semiconductor chips 111, 112, and 113.

In an embodiment, as illustrated in FIG. 9, bumps 111, 112B, and 113B may be formed on the connection pads 111P, 112P, and 113P, respectively. For example, the bumps 111B, 112B, and 113B may be formed of a metal or a solder. The semiconductor chips 111, 112, and 113 may be connected to an exposed upper redistribution layer 122c of the connection member 120 through the connection pads 111P, 112P, and 113P and/or the bumps 111B, 112B, and 113B. Connectors 115 such as solders, or the like, may be used in order to connect the semiconductor chips 111, 112, and 113 to the exposed upper redistribution layer 122c of the connection member 120. The respective semiconductor chips 111, 112, and 113 may be more stably mounted on the connection member 120 by an underfill resin 170.

The connection member 120 may redistribute the connection pads 111P, 112P, and 113P of the semiconductor chips 111, 112, and 113. The connection pads 111P, 112P, and 113P of the semiconductor chips 111, 112, and 113 having various functions may be redistributed by the connection member 120, and may be physically or electrically connected to an external apparatus through the connection terminals 150.

The connection member 120 may include insulating layers 121, the redistribution layers 122 formed on or in the insulating layers 121, and the vias 123 penetrating through the insulating layers 121 and electrically connecting the redistribution layers 122 formed on different layers to each other. The number of layers of the connection member 120 illustrated in FIG. 9 is only an example, and may be more than or less than that illustrated. The connection member 120 according to the embodiment illustrated in FIG. 9 may be used as a 2.5D type interposer.

For example, each of the insulating layers 121 may include a thermosetting resin such as an epoxy resin, a thermoplastic resin such as a polyimide resin, or a resin mixed with an inorganic filler, such as Ajinomoto build-up film (ABF). In some exemplary embodiments, each of the insulating layers 121 may include a photosensitive insulating material such as a photoimagable dielectric (PID) resin. In this case, the insulating layers 121 may be patterned by a precise photolithography process and be thus formed to have a smaller thickness, and the vias 123 having a finer pitch may be implemented. Even though the insulating layers 121 are shown to be multiple layers, when the respective layers are formed of the same material, they may be integrated with each other, such that a boundary therebetween may not be apparent. If necessary, some of the insulating layers 121, which are shown to be multiple layers, may also be formed of a material different from that of other insulating layers 121.

The redistribution layers 122 may serve to substantially redistribute the connection pads 111P, 11.2P, and 113P. A material of each of the redistribution layers 122 may be, for example, copper (Cu), aluminum (Al), silver (Ag), tin (Sn), gold (Au), nickel (Ni), lead (Pb), titanium (Ti), or alloys thereof. The redistribution layers 122 may perform various functions depending on designs of the respective layers. In some exemplary embodiments, the redistribution layers 122 may include ground (GND) patterns, power (PWR) patterns, signal (S) patterns, and the like, and may include via pads, connection terminal pads, and the like, if necessary.

The vias 123 may electrically connect the redistribution layers 122 formed on different layers to each other, resulting in an electrical path in the semiconductor package 100. For example, each of the vias 123 may include copper (Cu), aluminum (Al), silver (Ag), tin (Sn), gold (Au), nickel (Ni), lead (Pb), titanium (Ti), or alloys thereof.

As illustrated in FIG. 9, the connection member 120, in an embodiment, includes a first insulating layer 121a in contact with the passivation layer 130, a first redistribution layer 122a embedded in the first insulating layer 121a and in contact with the passivation layer 130 and the UBM vias 143, a second redistribution layer 122b disposed on the first insulating layer 121a, and first vias 123a penetrating through at least portions of the first insulating layer 121a and electrically connecting the first redistribution layer 122a and the second redistribution layer 122b to each other. Similarly, the insulating layers 121, the redistribution layers 122, and the vias 123 may be stacked as illustrated in FIG. 9. A width of a portion of the first via 123a in contact with the second redistribution layer 122b may be greater than that of a portion thereof in contact with the first redistribution layer 122a. That is, a cross-sectional shape of the via 123 of the connection member 120 may have a reverse trapezoidal shape (or a truncated inverse pyramidal shape) that is substantially similar in shape to that of the UBM via 143.

The connection member 120 may include a second insulating layer 121b in contact with an encapsulant 160 and/or an underfill resin 170 and a third redistribution layer 122c disposed on the second insulating layer 121b. The third redistribution layer 122c may have a shape in which it protrudes on an upper surface of the second insulating layer 121b, which is the uppermost insulating layer of the connection member 120. The third redistribution layer 122c may serve as pads for mounting the semiconductor chips 111, 112, and 113. A surface treatment layer P may be formed on a surface of the third redistribution layer 122c. The surface treatment layer P may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like. The third redistribution layer 122c and/or the surface treatment layer P may be connected to the connection pads 111P, 112P, and 113P and/or the bumps 111B, 112F, and 113B of the semiconductor chips 111, 112, and 113 through the connectors 115 such as the solders, or the like.

The passivation layer 130 may protect the connection member 120 from external physical or chemical damage. A material of the passivation layer 130 is not particularly limited. The insulating materials used as the material of the insulating layer 121 of the connection member 120 described elsewhere herein may be used as the material of the passivation layer 130. For example, the passivation layer 130 may be formed of ABF.

The connection terminals 150 may physically or electrically externally connect the semiconductor package 100. For example, the semiconductor package 100 may be mounted on the main board of the electronic device through the connection terminals 150. Each of the connection terminals 150 may be formed of a conductive material, for example, a solder, or the like. However, a material of each of the connection terminals 150 is not limited thereto. Each of the connection terminals 150 may have various structures such as a land, a ball, a pin, and the like. The connection terminals 150 may be formed as a multilayer or single layer structure. When the connection terminals 150 are formed as a multilayer structure, the connection terminals 150 may include a copper (Cu) pillar and a solder. When the connection terminals 150 are formed as a single layer structure, the connection terminals 150 may include a tin-silver solder or copper (Cu). However, the connection terminals 150 are not limited thereto.

The number, an interval, a disposition, or the like, of connection terminals 150 is not particularly limited, and may be variously modified, if necessary. For example, the number of connection terminals 150 may be variously implemented, and may be several tens to several thousands according to the numbers of connection pads 111P, 112P, and 113P. At least one of the connection terminals 150 may be disposed in a fan-out region. The fan-out region is a region except for a region in which the semiconductor chips 111, 112, and 113 are disposed.

The semiconductor package 100 according to an embodiment may be a fan-out semiconductor package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

The underfill resin 170 may more stably mount the semiconductor chips 111, 112, and 113 on the connection member 120. The underfill resin 170 may be a resin such as epoxy. In some exemplary embodiments, the underfill resin 170 may be omitted. Elements mounted on the connection member 120 may include electronic components such as passive elements in addition to the semiconductor chips 111, 112, and 113.

The encapsulant 160 may protect the semiconductor chips 111, 112, and 113, and the like. The encapsulant 160 may not surround entire surfaces of the semiconductor chips 111, 112, and 113. For example, as illustrated in FIG. 9, upper surfaces of the semiconductor chips 111, 112, and 113 may be exposed in order to dissipate heat, and these exposed surfaces, surfaces obtained by polishing the upper surfaces of the semiconductor chips 111, 112, and 113 together with an upper surface of the encapsulant, may be substantially coplanar with the upper surface of the encapsulant. A material of the encapsulant 160 may be an insulating material. The insulating material may be, for example, a thermosetting resin such as an epoxy resin, a thermoplastic resin such as a polyimide resin, or a resin mixed with an inorganic filler, such as ABF. In some exemplary embodiments, prepreg including a glass fiber may be used as the material of the encapsulant 160 or an epoxy molding compound (EMC) may be used as the material of the encapsulant 160.

Figure 12A:
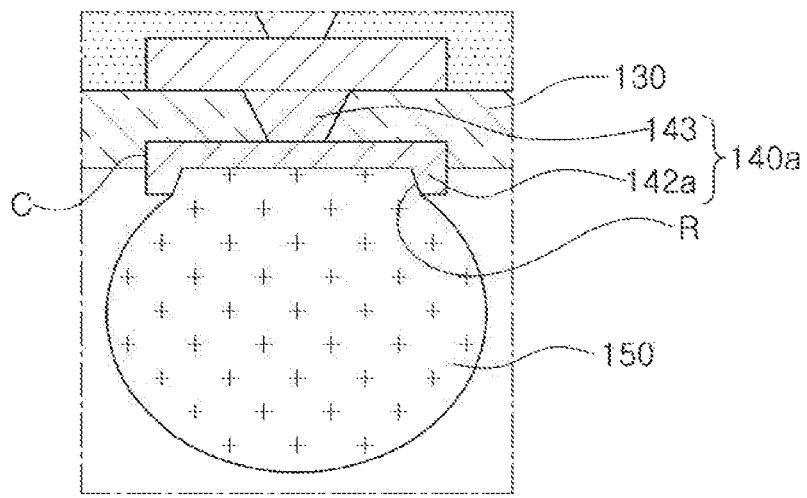
FIGS. 12A and 12B are cross-sectional views illustrating underbump metallurgy layers that may be used in the semiconductor package according to an exemplary embodiment in the present disclosure.
Figure 12B:
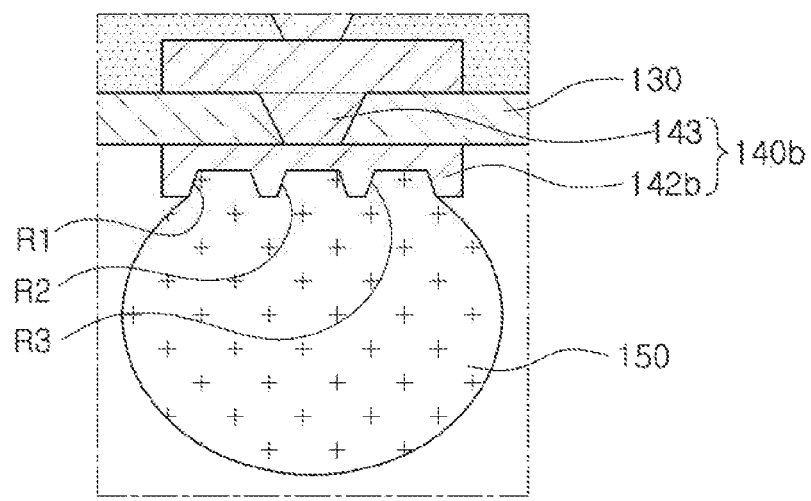

FIGS. 12A and 12B are cross-sectional views illustrating structures of underbump metallurgy (UBM) layers according to various modified examples. UBM layers 140a and 140b illustrated in FIGS. 12A and 12B may have structures that may be used in the semiconductor package illustrated in FIG. 9, and may be understood with reference to the description for the previous exemplary embodiment.

The UBM layer 140a illustrated in FIG. 12A may include an UBM pad 142a protruding from the passivation layer 130 and having a recess R. The connection terminal 150 may fill the recess R of the UBM pad 142a. The UBM pad 142a used in the present exemplary embodiment may stably limit a region in which the connection terminal 150 is to be formed to a region of the recess R and increase a contact area with the connection terminal 150.

Unlike the previous exemplary embodiment in which the side surfaces of the UBM pad 142 are almost exposed, in the present exemplary embodiment, only portions of the side surfaces of the UBM pad 142a may be exposed so that a surface of the UBM pad 142a in which the recess R is to be formed is sufficiently exposed, and the other portions C of the side surfaces of the UBM pad 142a may still be covered with the passivation layer 130. These exposed side surfaces may be comparatively precisely adjusted by determining a depth of a resin layer removed using plasma etching.

The UBM layer 140b illustrated in FIG. 12B may include an UBM pad 142b having three recesses R1, R2, and R3 separated from one another. The connection terminal 150 may be filled in a plurality of recesses R1, R2, and R3. The UBM pad 142b used in such an embodiment may significantly increase a contact area with the connection terminal 150 as compared to the UBM pad 142a illustrated in FIG. 12A by the plurality of recesses R1, R2, and R3, and connection reliability may thus be more excellent. In some embodiments, two, three or more recesses may be provided depending on the size of the UBM pad 142.

FIGS. 13A through 13D are cross-sectional views of the semiconductor package illustrated in FIG. 9 during a process of forming redistribution layers as well as an UBM layer, in accordance with an embodiment disclosed herein.

Figure 13A:
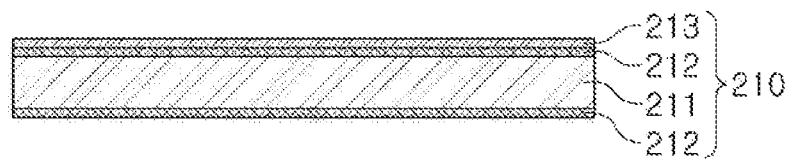
FIGS. 13A through 13D are cross-sectional views illustrating the semiconductor package of FIG. 9 during a process of forming a redistribution layer of a method of manufacturing the semiconductor package.

Referring to FIG. 13A, a carrier 210 for forming the redistribution layer is provided.

The carrier 210 may include a core layer 211 and metal layers 212 and 213 each formed on opposite surfaces of the core layer. The core layer 211 may be formed of an insulating resin or an insulating resin (for example, prepreg) including an inorganic filler and/or a glass fiber. The metal layers 212 and 213 may include a metal such as copper (Cu), titanium (Ti), or the like. Surface treatment may be applied or a release layer may be provided between the metal layers 212 and 213 and the core layer 211 in order to easily separate the metal layers 212 and 213 and the core layer 211 from each other. In some exemplary embodiments, the carrier 210 may be a general detach core.

Figure 13B:
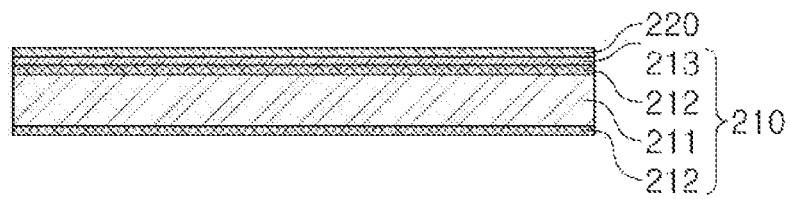

Then, as illustrated in FIG. 13B, a resin layer 220 is formed on the carrier 210.

Electrical insulation between the carrier 210 and the connection member 120 to be manufactured may be ensured by the resin layer 220. In detail, in order to normally perform an electrical test on the redistribution layers 122 (see FIG.

13D) after completion of the connection member 120 (see FIG. 13D), the resin layer 220 may be formed to insulate the redistribution layer of the connection member and the metal layer 212 of the carrier 210 from each other. The resin layer 220 may be formed by laminating a film form or applying and hardening a liquid phase form. The resin layer 220 may also be omitted, if necessary.

Figure 13C:
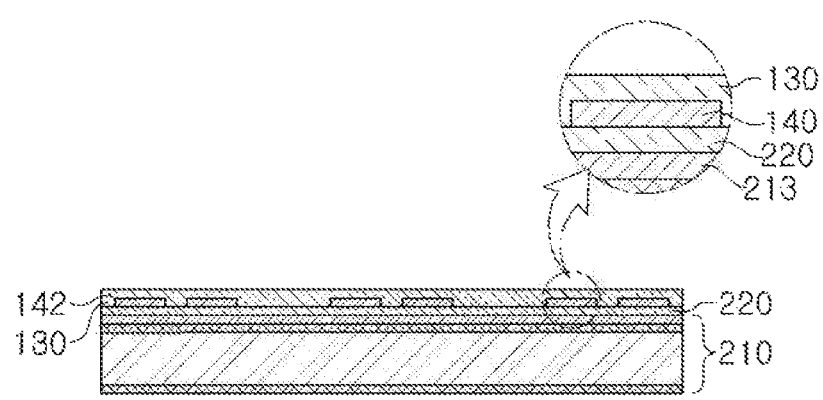

Then, as illustrated in FIG. 13C, the UBM pads 142 and the passivation layer 130 are formed.

In order to form the UBM pads 142 for the UBM layer, a seed layer may be formed on the resin layer 220, patterns may be formed using a dry film, or the like, and the patterns may be filled by a plating process. Then, the passivation layer 130 covering the UBM pads 142 may be formed. When the resin layer 220 is omitted, the UBM pads 142 may be formed using a second metal layer 213 of the carrier 210 as a seed layer.

Figure 13D:
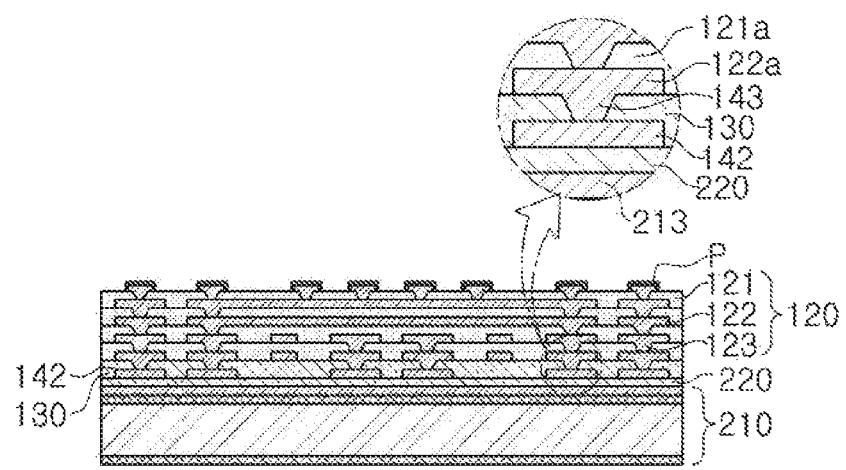

Then, as illustrated in FIG. 13D, the connection member 120 may be formed on the passivation layer 130.

A process of forming the connection member 120 may be performed on the same process line as a process line on which a process of forming the passivation layer 130 covering the UBM pads 142, which is the previous process, is performed. In the present process, holes may be formed in the passivation layer 130, the first redistribution layer 122a may be formed while the holes are filled by a plating process, or the like, and formation of the insulating layer 121, formation of via holes, filling, and formation of patterns may be repeatedly performed to form the connection member 120 having additional redistribution layers 122 and vies 123. Additionally, the surface treatment layer P may be formed on the third (e.g., in the embodiment having three redistribution layers) redistribution layer 122c formed at an upper portion of the connection member 120. In embodiments have a different number of redistribution layers 122, the surface treatment layer P may be formed on the last (or as illustrated in the Figures, topmost) redistribution layer.

After the connection member 120 is formed and before the semiconductor chip is mounted, a quad route test and an electrical test verification procedure of the redistribution layers may be performed. Therefore, before the semiconductor chip is mounted, a defect of the redistribution layers, or the like, may be confirmed in advance, such that cost loss due to defective products being discarded may be significantly reduced.

In the present process, the UBM vias 143 formed in the holes of the passivation layer 130 may be formed together with the first redistribution layer 122a. This case is different from a case in which an UBM via and an UBM pad are formed together with each other in an integrated structure in an UBM layer last process. As described above, the UBM via 143 used in the embodiments of the present disclosure may have a structure integrated with the first redistribution layer 122a adjacent thereto, unlike the structure according to the related art.

In the present disclosure, a term "integrated structure" does not mean that two components are simply in contact with each other, but refers to a structure in which two components are formed integrally with each other using the same material by the same process. For example, when a via and a pattern (for example, a redistribution layer or a pad) are simultaneously formed by the same plating process, the via and the pattern are called an integrated structure.

Unlike the UBM layer last process, in the method of manufacturing the semiconductor package according to embodiments of present disclosure, when the connection member 120 is formed before the semiconductor chip is mounted, the UBM layer 140 may be formed in advance on the connection member 120. For example, the UBM layer 140 and the passivation layer 130 may be formed in a process line in which the connection member 120 is formed before the connection member 120 is formed. As described above, the UBM layer 140 and the redistribution layers 122 and the vias 123 of the connection member 120 may be continuously formed on the same process line.

Therefore, in a method of manufacturing the semiconductor package according to present disclosure, after the semiconductor package is completed, an additional carrier for forming the UBM layer may not be required, and a separate dedicated line for forming the UBM layer may be omitted. In addition, in a process of forming the UBM layer, a risk due to a pollutant of a package process may be removed.

Figure 14A:
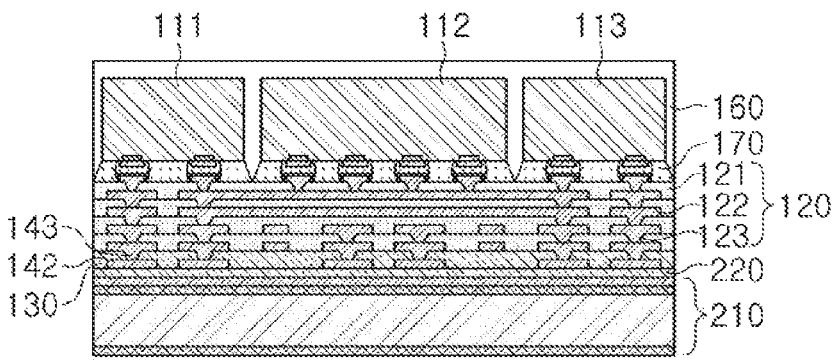
FIGS. 14A through 14D are cross-sectional views illustrating the semiconductor package of FIG. 9 during a process of forming a package of a method of manufacturing the semiconductor package.

FIGS. 14A through 14O are cross-sectional views illustrating the semiconductor package of FIG. 9 during a process of manufacturing the semiconductor package using the connection member illustrated in FIG. 13O.

As illustrated in FIG. 14A, the semiconductor chips 111, 112, and 113 are mounted on the connection member 120.

The mounting process may be performed using the solders 115, or the like. Additionally, the semiconductor chips 111, 112, and 113 may be more stably fixed by the underfill resin 110. Then, the encapsulant 160 encapsulating the semiconductor chips 111, 112, and 113 may be formed on the connection member 120. The encapsulant 160 may be formed by laminating a film form or applying and hardening a liquid phase form.

Figure 14B:
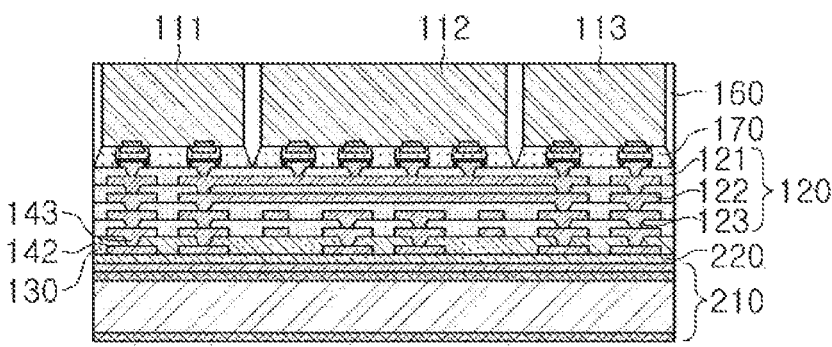

Then, as illustrated in FIG. 14B, the encapsulant 160 may be grinded so that surfaces of the semiconductor chips 111, 112, and 113 are exposed.

Upper surfaces of the respective semiconductor chips 111, 112, and 112 may be disposed on the same level after the grinding process, and may be substantially coplanar with an upper surface of the encapsulant. Since portions of the semiconductor chips partially removed in the grinding process are from their respective inactive regions, they may not be related to functions, and the semiconductor chips are exposed externally of the encapsulant, and a heat dissipation effect may be improved.

Figure 14C:
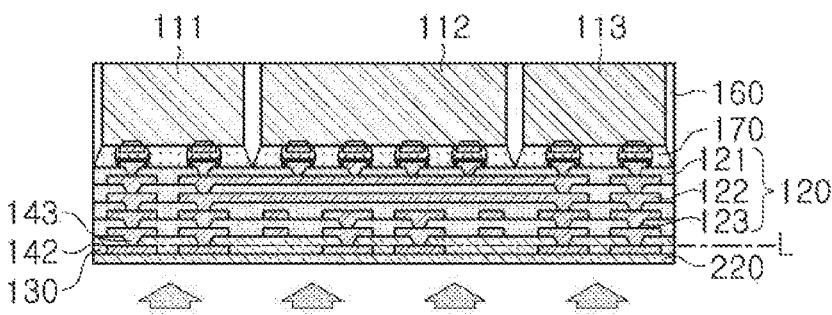

Then, as illustrated in FIG. 14C, the carrier 210 is separated from the connection member 120.

A process of separating the carrier 210 may be performed by separation of the metal layers 212 and 213. For example, the release layer between the metal layers and the core layer may be used. After the process of separating the carrier, the metal layer 213 may be removed from the connection member 210 by an etching process. The resin layer 220 may protect the UBM pads 142 in the process of etching the metal layer. After the process of separating the carrier, the resin layer 220 may be removed so that the UBM pads 142 are exposed, and portions of the passivation layer 130 may be removed to allow the UBM pads 142 to protrude from a surface of the remaining passivation layer 130.

As illustrated in FIG. 14C, portions of the resin layer and the passivation layer may be removed up to a level "L" so that the UBM pads 142 protrude from the surface of the remaining passivation layer 130.

In an embodiment, plasma etching may be used in the process of removing the resin layer 220 and the passivation layer 130. For example, plasma containing oxygen may be used to effectively and precisely remove the resin layer 220 and the passivation layer 130 formed of an insulating material similar to that of the resin layer 220.

In some exemplary embodiments, an etch rate may be adjusted to about 1 μm/min, and etching dispersion up to 5% or less (for example, 3%) may be obtained to effectively remove insulating material layers (for example, the resin layer and the passivation layer) having a sufficient thickness. In addition, the removing process may have high selectivity with respect to the UBM pads 142 formed of a metal to effectively expose connection surfaces of the UBM pads 142 without damaging the UBM pads 142. An etching depth may be precisely controlled up to several micrometers or several sub-micrometers.

As in the present exemplary embodiment, a process of exposing the UBM pads using the plasma etching may provide an advantage that a separate patterning process for forming openings in the passivation layer 130 may be omitted.

In an embodiment, the process of exposing the UBM pads 142 may be performed together with another process such as a grinding process. For example, the resin layer 220 may be removed by the grinding process, the passivation layer may be precisely removed by the plasma etching.

Figure 14D:
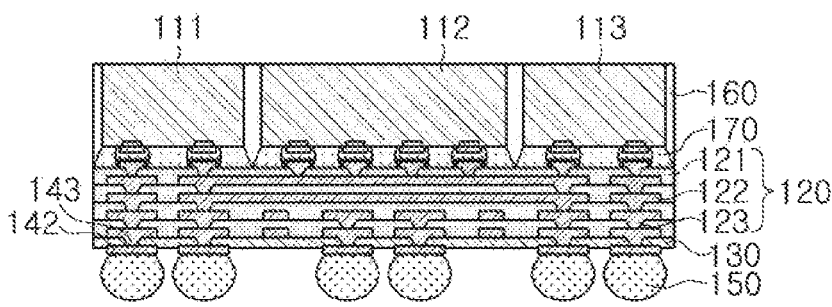

Then, as illustrated in FIG. 14D, the connection terminals 150 such as the solders are formed on the exposed UBM pads 142 to manufacture the semiconductor package 100 illustrated in FIG. 9. In this process, a desmear process for removing residues may be performed, if necessary.

FIGS. 15A through 15E are cross-sectional views illustrating the semiconductor package during a process of forming a redistribution layer of a method of manufacturing a semiconductor package according to another exemplary embodiment in the present disclosure.

Figure 15A:
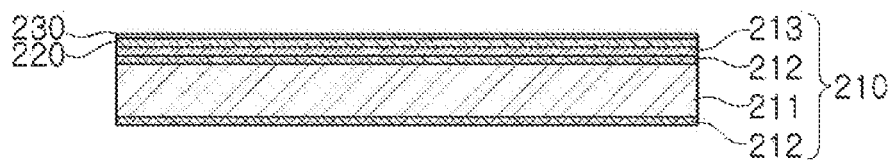
FIGS. 15A through 15E are cross-sectional views illustrating the semiconductor package during a process of forming a redistribution layer of a method of manufacturing a semiconductor package according to another exemplary embodiment in the present disclosure.

Referring to FIG. 15A, a photoresist 230 is formed on a resin layer 220 disposed on a carrier 210. The carrier 210 may be understood with reference to the carrier 210 described in FIG. 13*a*. When the resin layer 220 is omitted, the photoresist 230 may be formed on the metal layer 213 of the carrier 210. While the photoresist 230 is described by way of example, another material having a block shape, for example, another insulator such as oxide or a metal such as nickel, or the like, may be used.

Figure 15B:
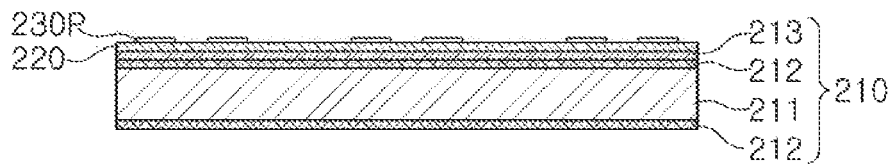
Figure 15C:
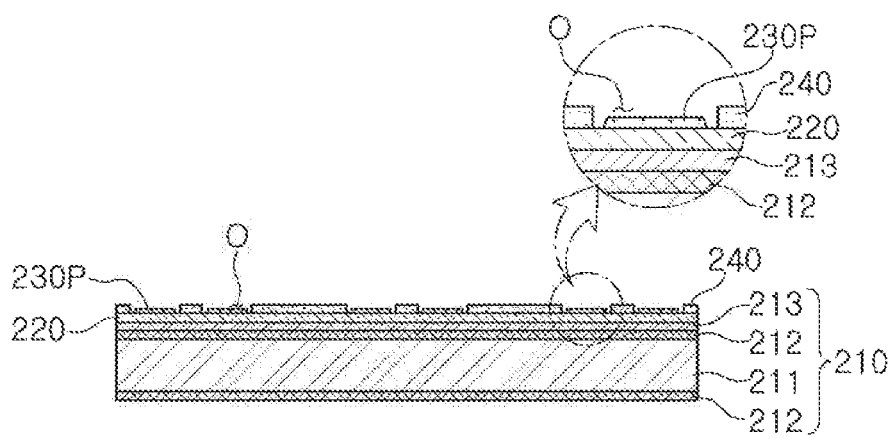
Figure 15D:
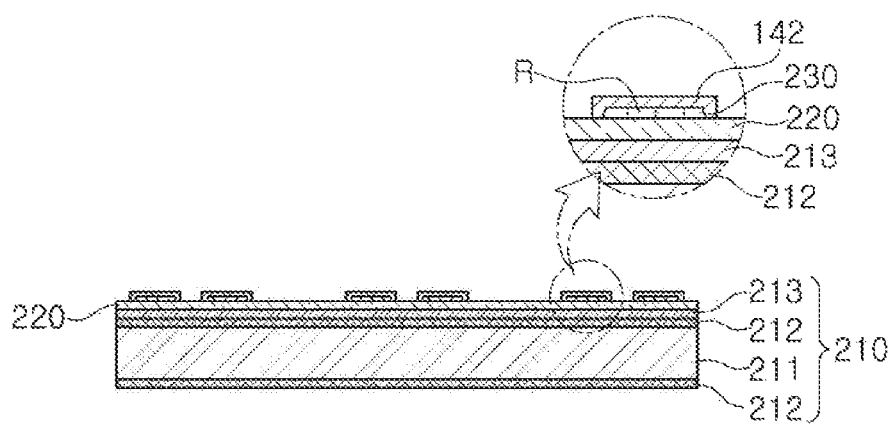

Then, as illustrated in FIG. 15B, the photoresist 230 is patterned to form recess patterns 230P corresponding to recesses ("R" in FIG. 15D). The patterning process may be performed by exposure and development.

Then, as illustrated in FIG. 15C, a dry film 240 having openings O for UBM pads is formed in regions in which the recess patterns 230P are formed.

In an embodiment, the dry film 240 may be formed on the resin layer 220, and the openings O may be formed in the dry film 240 by exposure and development. The dry film 240 may be formed at a height greater than a thickness of the recess patterns 230P in consideration of a thickness of the UBM pads, and the openings O may be formed at an area greater than that of the recess patterns 230P.

Then, as illustrated in FIG. 15D, the openings O of the dry film 240 may be filled by plating to form the UBM pads 142, and the dry film 240 may be removed.

The desired UBM pads 142 may be obtained by such filling and removing processes. Although not illustrated, a seed layer may be used in the present plating process.

Figure 15E:
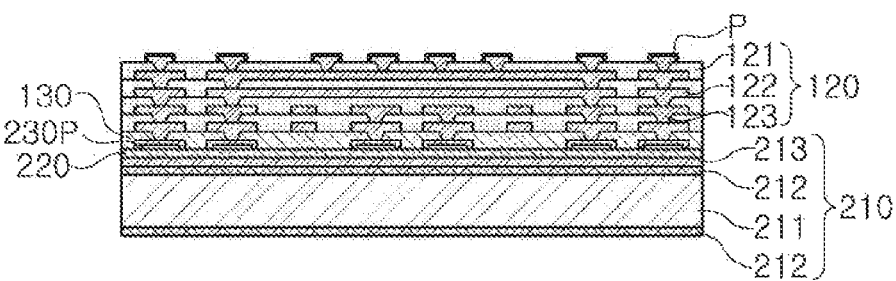

Then, as illustrated in FIG. 15E, the passivation layer 130 may be formed on the UBM pads 142, and the connection member 120 may be formed on the passivation layer 130.

A process of forming the connection member 120 according to an exemplary embodiment may be understood with reference to the description related to FIG. 13D. The process of forming the connection member 120 may be performed on the same process line as a process line on which the processes of forming the passivation layer 130 and the UBM pads 142 are performed. After the connection member 120 is formed and before the semiconductor chips are mounted, a quad route test and an electrical test verification procedure of the redistribution layers may be performed. In an embodiment, the UBM vias 143 formed in the holes of the passivation layer 130 may be formed together with the first redistribution layer 122*a*. Therefore, the UBM via 143 may have a structure integrated with the first redistribution layer 122*a*.

Figure 16A:
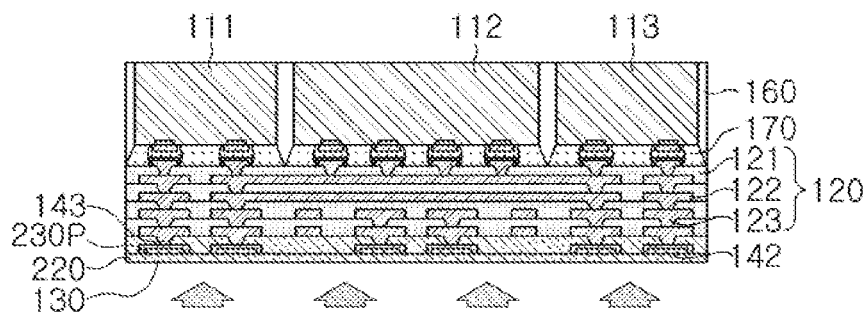
FIGS. 16A through 16C are cross-sectional views illustrating the semiconductor package during a process of forming a package of a method of manufacturing a semiconductor package according to another exemplary embodiment in the present disclosure.
Figure 16B:
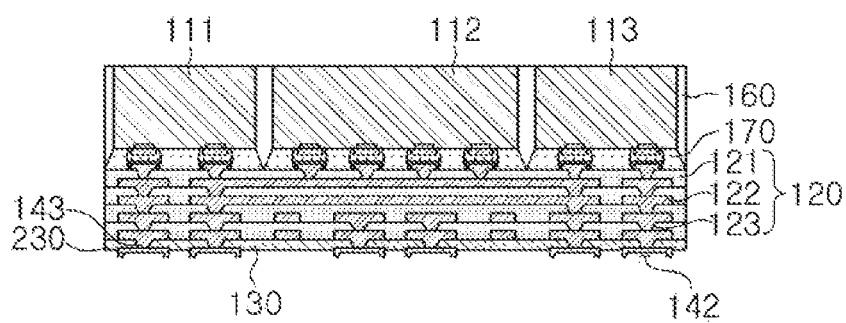
Figure 16C:
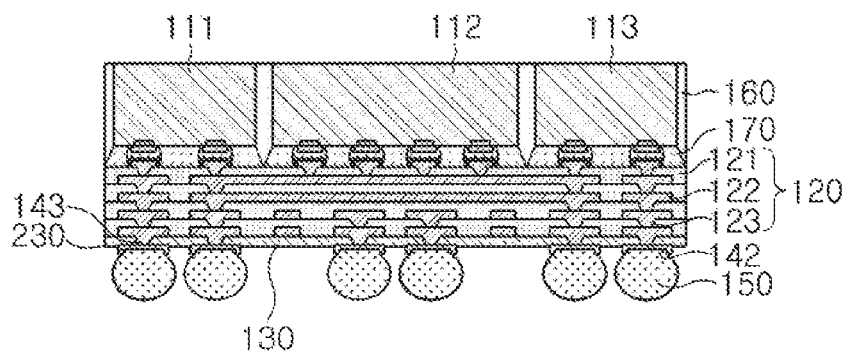

FIGS. 16A through 16C are cross-sectional views illustrating the semiconductor package during a process of forming a package of a method of manufacturing a semiconductor package according to another exemplary embodiment in the present disclosure.

First, referring to FIG. 16A, a package structure in a state in which the carrier 210 is separated from the connection member 120 and the metal layer 213 is removed is illustrated.

The structure illustrated in FIG. 16A, which is a package manufactured using the connection member illustrated in FIG. 15E, may be understood as a result obtained by performing a process of separating the carrier and a process of etching the metal layers (see FIGS. 14C and 14D) as well as a process of mounting the semiconductor chips and a process of forming the encapsulant (see FIGS. 14A and 14B).

Referring to FIG. 16B, portions of the resin layer and the passivation layer may be removed by plasma etching.

The UBM pads 142 may protrude from a surface of the remaining passivation layer 130 by the present removing process. In the present process, plasma etching containing oxygen may be used to remove the recess patterns 230P formed of an organic material together with portions of the resin layer 220 and the passivation layer 130. The plasma etching may be used to expose the UBM pads 142 at a desired thickness while effectively removing the recess patterns 230P positioned in the recesses R of the UBM pads 142, and a separate patterning process for forming the openings in the passivation layer 130 may thus be omitted.

Then, as illustrated in FIG. 16C, the connection terminals 150 such as the solders may be formed on the exposed UBM pads 142 to manufacture the semiconductor package 100 illustrated in FIG. 9. In the present process, a desmear process for removing residues may be performed, if necessary.

Figure 17:
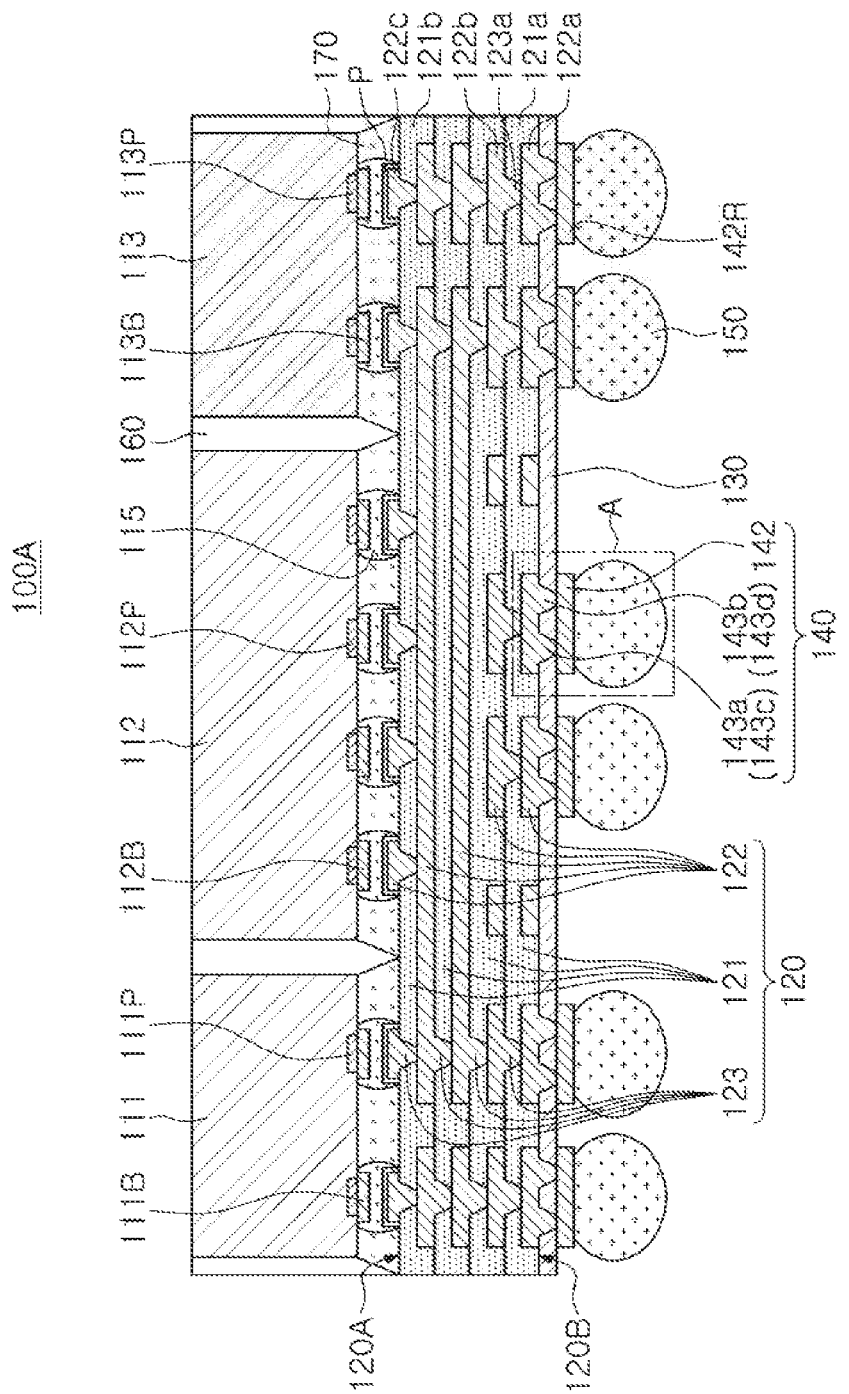
FIG. 17 is a side cross-sectional view illustrating a semiconductor package according to another exemplary embodiment in the present disclosure.
Figure 18A:
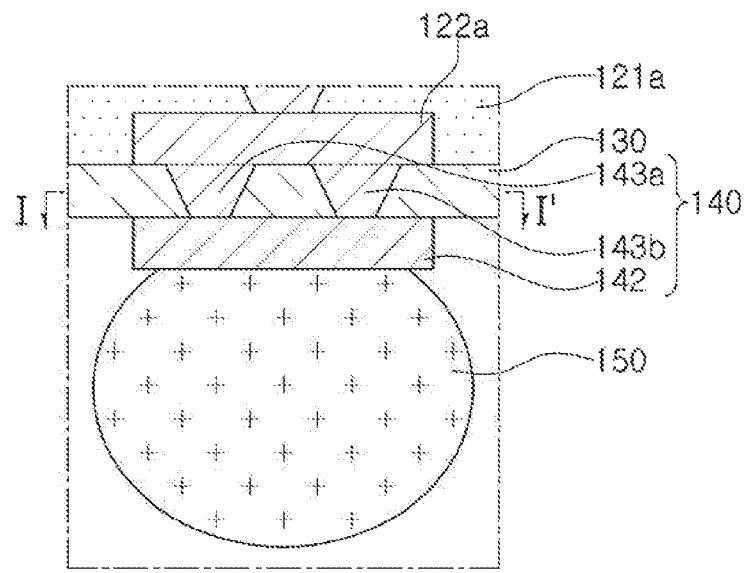
FIGS. 18A and 18B are, respectively, an enlarged view and a plan view illustrating a region (part A) of the semiconductor package illustrated in FIG. 17.
Figure 18B:
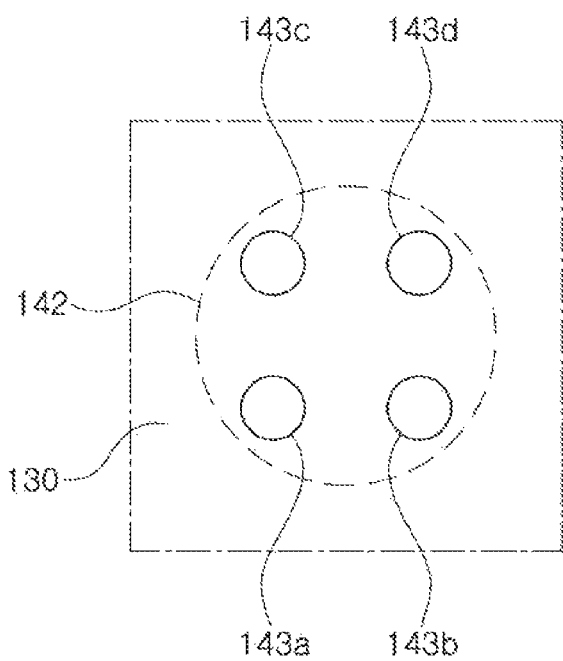

FIG. 17 is a side cross-sectional view illustrating a semiconductor package according to another exemplary embodiment in the present disclosure, and FIGS. 18A and 18B are, respectively, an enlarged view and a plan view illustrating a region (part A) of the semiconductor package illustrated in FIG. 17.

Referring to FIG. 17, a semiconductor package 100 according to an exemplary embodiment may be understood to be similar to the fan-out semiconductor package 100 illustrated in FIGS. 9 and 10 except that it has a multi-via layer 140' in which a plurality of UBM vias 143*a*, 143*b*, 143*c*, and 143*d* connected to one UBM pad 142. Components according to the such an may be understood with reference to the description for the same or similar components of the fan-out semiconductor package 100 illustrated in FIGS. 9 and 10 unless explicitly described to the contrary.

The UBM layer 140' used in the embodiment illustrated in FIG. 17 may include four UBM vias 143*a*, 143*b*, 143*c*, and 143*d* connected to the redistribution layer 122 of the connection member 120 and the UBM pad 142 connected to the four UBM vias 143a, 143b, 143c, and 143d, as illustrated in FIGS. 18A and 18B.

In such an embodiment, the UBM vias 143a, 143b, 143c, and 143d may be embedded in the passivation layer 130, while the UBM pad 142 may protrude from a surface of the passivation layer 130. Therefore, both of easy connection to the UBM pads 142 and structural stability of the UBM layer 140 may be ensured. Exposure of the UBM pads 142 may be performed by a resin removing process such as plasma etching. A case in which the UBM layer 140' used in the present exemplary embodiment includes the four UBM vias 143a, 143b, 143c, and 143d is illustrated, but the UBM layer 140' may include another number of UBM vias.

As described above, in the semiconductor package 100A according to an exemplary embodiment, a plurality of UBM vias connecting the first redistribution layer 122a disposed at the outermost portion and the UBM pad 142 to each other may be used, such that stress may be dispersed through the UBM vias, a ratio of an area occupied by a metal may be increased, and sufficient resistance to the stress may be secured. Resultantly, the problem of the board level reliability described above may be improved.

As set forth above, according to the exemplary embodiment in the present disclosure, a semiconductor package having a structure of a UBM layer having a simplified manufacturing process and in which high reliability is secured may be provided.

The UBM pad may be exposed from the passivation layer to ensure stably connection and provide the UBM layer having high structural reliability. In addition, the UBM layer may be formed together with the redistribution layer before the semiconductor chip is mounted, such that a separate dedicated line for forming the UBM layer may be omitted, and a dedicated carrier may be omitted.

While exemplary embodiments have been shown and described above, it will be apparent to those skilled in the art that modifications and variations could be made without departing from the scope of the present disclosure as defined by the appended claims.

The invention claimed is:

1. A method of manufacturing a semiconductor package, the method comprising:
preparing a carrier layer;
forming an underbump metallurgy (UBM) pad and a passivation layer covering the UBM pad on the carrier layer;
forming a hole exposing a portion of the UBM pad in the passivation layer;
forming a connection member having first and second redistribution layers and an insulating member embedding the first and second redistribution layers over the passivation layer, the first redistribution layer having a UBM via contacting the exposed portion of the UBM pad through the hole in the passivation layer;
disposing a semiconductor chip on the connection member such that a connection pad of the semiconductor chip is electrically connected to the UBM pad through the first and second redistribution layers;
removing the carrier layer from the passivation layer; and
etching the passivation layer to reduce a thickness of the passivation layer, whereby at least a portion of a side surface of the UBM pad is exposed.

2. The method of claim 1, wherein a width of a portion of the UBM via in contact with the UBM pad is narrower than a width of a portion of the UBM via in contact with the redistribution layer.

3. The method of claim 1, wherein adhesive strength between the UBM via and the first redistribution layer is greater than that between the UBM via and the UBM pad.

4. The semiconductor package of claim 1, wherein the UBM via and the first redistribution layer are formed by single plating process.

5. The method of claim 1, wherein a first portion of the side surface of the UBM pad is exposed from the passivation layer and a second portion of the side surface of the UBM pad is surrounded by the passivation layer.

6. The method of claim 1, wherein the preparing the carrier layer comprises forming a resin layer on the carrier layer, and the method further comprises, after the removing the carrier layer, removing the resin layer from the passivation layer.

7. The method of claim 6, wherein the removing the resin layer comprises grinding the resin layer so as to expose the passivation layer and the UBM pad.

8. The method of claim 6, wherein the removing the resin layer and the etching the passivation layer are performed by a single etching process.

9. The method of claim 8, wherein the etching the passivation layer is performed by a plasma etching process.

10. The method of claim 1, wherein a lower surface of the UBM pad exposed from the passivation layer has a recess.

11. The method of claim 1, wherein the insulating member includes:
a first insulating layer covering the first redistribution layer; and
a second insulating layer covering the second redistribution layer on the first insulating layer,
wherein the second redistribution layer has a redistribution via contacting the first redistribution layer through a hole provided in the first insulating layer.

12. The method of claim 1, further comprising, after the disposing the semiconductor chip, forming an encapsulant encapsulating the semiconductor chip provided on the connection member.

13. The method of claim 12, further comprising grinding the encapsulant to expose an upper surface of the semiconductor chip.

14. The method of claim 1, further comprising forming a connection terminal on the UBM pad.

15. A method of manufacturing a semiconductor package, the method comprising:
forming a resin layer on a carrier layer;
forming a UBM pad and a passivation layer covering the UBM pad on the resin layer;
forming a hole exposing a portion of the UBM pad in the passivation layer;
forming a connection member having a redistribution layer and an insulating layer covering the redistribution layer over the passivation layer, the redistribution layer having a UBM via contacting the exposed portion of the UBM pad through the hole of the passivation layer;
disposing a semiconductor chip on the connection member such that a connection pad of the semiconductor chip is electrically connected to the UBM pad through the redistribution layer;
removing the carrier layer from the passivation layer; and
performing a plasma etching process such that the resin layer is removed and a thickness of the passivation layer is reduced, whereby at least a portion of a side surface of the UBM pad is exposed.

16. The method of claim 15, wherein the plasma etching process is performed by using a plasma of an oxygen-containing gas.

17. The method of claim 15, wherein a cross-section of the UBM via, when viewed in a thickness direction of the connection member, has a reverse trapezoidal shape.

18. A method of manufacturing a semiconductor package, the method comprising:

forming a sacrificial pattern on a carrier layer;

forming a UBM pad covering the sacrificial pattern and a passivation layer covering the UBM pad on the carrier layer;

forming a hole exposing a portion of the UBM pad in the passivation layer;

forming a connection member having a redistribution layer and an insulating layer covering the redistribution layer over the passivation layer, the redistribution layer having a UBM via contacting the exposed portion of the UBM pad through the hole of the passivation layer;

disposing a semiconductor chip on the connection member such that a connection pad of the semiconductor chip is electrically connected to the UBM pad through the redistribution layer;

removing the carrier layer from the passivation layer; and etching the sacrificial pattern and the passivation layer such that the sacrificial pattern is removed and a thickness of the passivation layer is reduced, whereby at least a portion of a side surface of the UBM pad is exposed and the UBM pad has a recess corresponding to the sacrificial pattern.

19. The method of claim 18, wherein the sacrificial pattern includes a photoresist.

20. The method of claim 18, wherein the preparing the carrier layer comprises forming a resin layer on the carrier layer, and wherein the removing the resin layer and the sacrificial pattern and the passivation layer are performed by a plasma etching process.

* * * * *